US009659615B1

(12) United States Patent
Kwak et al.

(10) Patent No.: US 9,659,615 B1
(45) Date of Patent: May 23, 2017

(54) SEMICONDUCTOR DEVICE COMPRISING PIPE LATCH CIRCUIT AND AUTO-PRECHARGE SIGNAL GENERATION CIRCUIT

(71) Applicant: SK hynix Inc., Icheon-si, Gyeonggi-do (KR)

(72) Inventors: Myung Kyun Kwak, Yongin-si (KR); Seung Hun Lee, Icheon-si (KR); Tae Yong Lee, Seoul (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/193,457

(22) Filed: Jun. 27, 2016

(30) Foreign Application Priority Data

Mar. 17, 2016 (KR) ........................ 10-2016-0032406

(51) Int. Cl.
*G11C 7/00* (2006.01)
*G11C 7/12* (2006.01)
*G11C 7/10* (2006.01)
*G11C 7/22* (2006.01)

(52) U.S. Cl.
CPC .............. *G11C 7/12* (2013.01); *G11C 7/1039* (2013.01); *G11C 7/222* (2013.01)

(58) Field of Classification Search
CPC ....... G11C 7/1051; G11C 7/1039; G11C 7/22; G11C 7/222; G11C 11/4096; G11C 7/1078; G11C 7/12
USPC ................................ 365/189.05, 203, 233.1
See application file for complete search history.

(56) References Cited

U.S. PATENT DOCUMENTS 8,331,179 B2 * 12/2012 Kim ........................ G11C 7/12
365/189.05
2011/0216621 A1 9/2011 Wong et al.

FOREIGN PATENT DOCUMENTS

KR 1020050068373 A 7/2005
KR 10-2012-0087570 A 8/2012

* cited by examiner

*Primary Examiner* — David Lam
(74) *Attorney, Agent, or Firm* — William Park & Associates Ltd.

(57) ABSTRACT

A semiconductor device may include an input/output control signal generation circuit configured to generate at least one input control signal and at least one output control signal from a first control clock in response to a shifting control signal, a bank address latch circuit configured to generate a latch bank address signal by latching at least one bank address in response to the at least one input control signal and the at least one output control signal, a pipe latch circuit configured to generate an auto-precharge latch signal by latching an auto-precharge flag signal in response to the at least one input control signal and the at least one output control signal, and an auto-precharge signal generation circuit configured to generate at least one auto-precharge signal from the auto-precharge latch signal.

20 Claims, 6 Drawing Sheets

SEMICONDUCTOR DEVICE COMPRISING PIPE LATCH CIRCUIT AND AUTO-PRECHARGE SIGNAL GENERATION CIRCUIT

CROSS-REFERENCES TO RELATED APPLICATIONS

The present application claims priority under 35 U.S.C. §119(a) to Korean application number 10-2016-0032406, filed on Mar. 17, 2016, which is incorporated by reference in its entirety.

BACKGROUND OF THE INVENTION

1. Technical Field

The present disclosure relates to a semiconductor device which performs an auto-precharge operation.

2. Related Art

A semiconductor device performs a read operation with an auto-precharge operation and a write operation with an auto-precharge operation. When performing a read operation and a write operation, read-to-precharge time tRTP and write recovery time tWR are items of note.

SUMMARY OF THE INVENTION

Embodiments of the present disclosure are directed to a semiconductor device which performs a read operation with an auto-precharge operation and a write operation with an auto-precharge operation.

In one embodiment, a semiconductor device may include an input/output control signal generation circuit configured to generate at least one input control signal and at least one output control signal from a first control clock in response to at least one shifting control signal, a bank address latch circuit configured to generate a latch bank address signal by latching at least one bank address in response to the at least one input control signal and the at least one output control signal, a pipe latch circuit configured to generate an auto-precharge latch signal by latching an auto-precharge flag signal in response to the at least one input control signal and the at least one output control signal, and an auto-precharge signal generation circuit configured to generate at least one auto-precharge signal from the auto-precharge latch signal in response to at least one bank decoding signal generated by decoding the bank address signal.

In another embodiment, a semiconductor device may include a first input/output control signal generation circuit configured to generate at least one first input control signal and at least one first output control signal from a first control clock in response to at least one first shifting control signal, a second input/output control signal generation circuit configured to generate at least one second input control signal and at least one second output control signal from a second control clock in response to at least one second shifting control signal, a bank address latch circuit configured to generate a latch bank address signal by latching at least one bank address in response to the at least one first input control signal and the at least one first output control signal, a first pipe latch circuit configured to generate a first auto-precharge latch signal by latching a first auto-precharge flag signal in response to the at least one first input control signal and the at least one first output control signal, a second pipe latch circuit configured to generate a second auto-precharge latch signal by latching a second auto-precharge flag signal in response to the at least one second input control signal and the at least one second output control signal, and an auto-precharge signal generation circuit configured to generate at least one auto-precharge signal from the first or second auto-precharge latch signal in response to at least one bank decoding signal generated by decoding the latch bank address signal.

DESCRIPTION OF SPECIFIC EMBODIMENTS

Embodiments of the disclosure will hereinafter be described in detail with reference to the accompanying drawings. It should be noted that the drawings are not to precise scale and may be exaggerated in thickness of lines or sizes of components for descriptive convenience and clarity only. Furthermore, the terms as used herein are defined by taking functions of the disclosure into account and can be changed according to the custom or intention of users or operators. Therefore, definition of the terms should be made according to the overall disclosures set forth herein.

Figure 1:
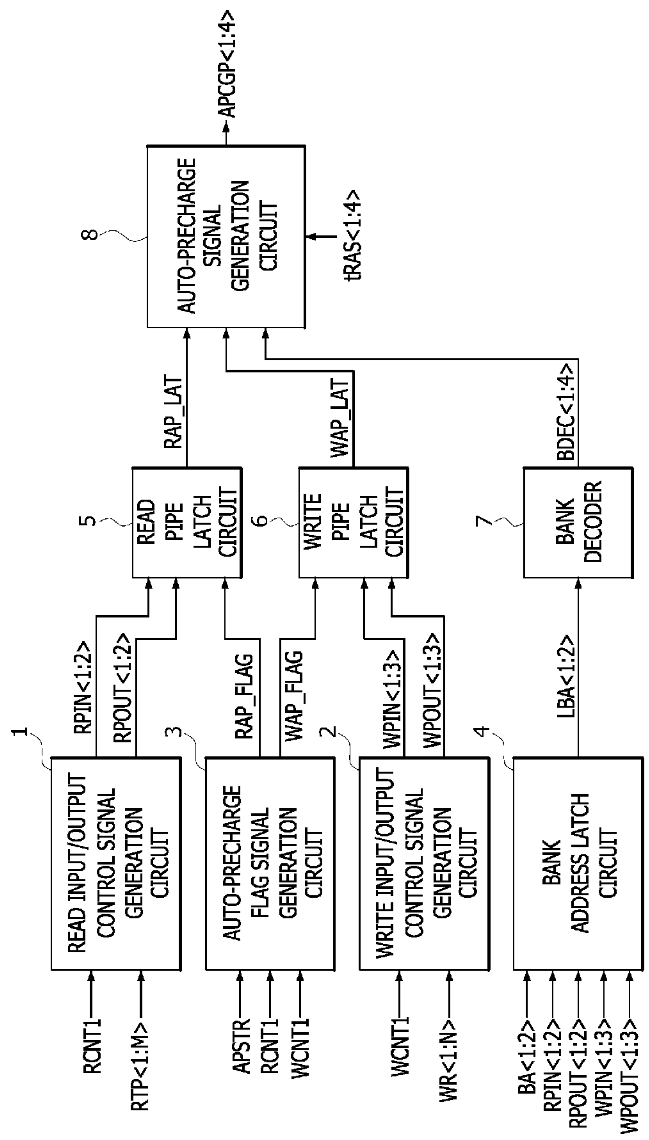
FIG. 1 is a block diagram illustrating a configuration of a semiconductor in accordance with an embodiment.

As illustrated in FIG. 1, a semiconductor device in accordance with an embodiment may include a read input/output control signal generation circuit 1, a write input/output control signal generation circuit 2, an auto-precharge flag signal generation circuit 3, a bank address latch circuit 4, a read pipe latch circuit 5, a write pipe latch circuit 6, a bank decoder 7, and an auto-precharge signal generation circuit 8.

The read input/output control signal generation circuit 1 may generate first and second read input control signals RPIN<1:2> and first and second read output control signals RPOUT<1:2> from a first read control clock RCNT1 in response to first to Mth read shifting control signals RTP<1:M>. The first to Mth read shifting control signals RTP<1:M> may have a logic level combination which is set by a read-to-precharge time tRTP. For example, when the read-to-precharge time tRTP is set to 2tCK (two-cycle section of operation clock), only the second read shifting control signal RTP<2> of the first to Mth read shifting control signals RTP<1:M> may be set to a logic high level. The first read control clock RCNT1 may be set to an internal clock and the first read control clock RCNT1 may toggle after a read burst operation ends. The read burst operation may end when data corresponding to a bit number set to a burst are all outputted during a read operation. For example, when the burst is 4, the read burst operation may end in a case where 4-bits of data are all outputted.

The write input/output control signal generation circuit 2 may generate first to third write input control signals WPIN<1:3> and first to third write output control signals WPOUT<1:3> from a first write control clock WCNT1 in response to first to Nth write shifting control signals WR<1:N>. The first to Nth write shifting control signals WR<1:N> may have a logic level combination set by a write recovery time tWR. For example, when the write recovery time tWR is set to 3tCK (three-cycle section of operation clock), only the third write shifting control signal WR<3> of the first to Nth write shifting control signals WR<1:N> may be set to a logic high level. The first write control clock WCNT1 may be set to an internal clock and the first write control clock WCNT1 may toggle after a write burst operation ends. The write burst operation may end when data corresponding to a bit number set to a burst are all inputted during a write operation. For example, when the burst is 4, the write burst operation may end in a case where 4-bits of data are all inputted.

The auto-precharge flag signal generation circuit 3 may generate a read auto-precharge flag signal RAP_FLAG and a write auto-precharge flag signal WAP_FLAG from an auto-precharge start signal APSTR in response to the first read control clock RCNT1 and the first write control block WCNT1. The auto-precharge start signal APSTR may be set to a signal which is enabled to perform an auto-precharge charge operation. The auto-precharge flag signal generation circuit 3 may generate the read auto-precharge flag signal RAP_FLAG from the auto-precharge start signal APSTR when the first read control clock RCNT1 toggles after a read burst operation has ended. That is, the auto-precharge flag signal generation circuit 3 may generate the read auto-precharge flag signal RAP_FLAG which is enabled by the enabled auto-precharge start signal APSTR in a state where the first read control clock RCNT1 toggles after the read burst operation has ended. The read auto-precharge flag signal RAP_FLAG may be enabled as the logic level thereof transitions or is enabled as a pulse generated at a preset pulse width is contained therein. The auto-precharge flag signal generation circuit 3 may generate the write auto-precharge flag signal WAP_FLAG from the auto-precharge start signal APSTR when the first write control clock WCNT1 toggles after a write burst operation has ended. That is, the auto-precharge flag signal generation circuit 3 may generate the write auto-precharge flag signal WAP_FLAG which is enabled by the enabled auto-precharge start signal APSTR in a state where the first write control clock WCNT1 toggles after the write burst operation has ended. The write auto-precharge flag signal WAP_FLAG may be enabled as the logic level thereof transitions or is enabled as a pulse generated at a preset pulse width is contained therein.

The bank address latch circuit 4 may generate first and second latch bank address signals LBA<1:2> by latching first and second bank addresses BA<1:2> in response to the first and second read input control signals RPIN<1:2>, the first and second read output control signals RPOUT<1:2>, the first to third write input control signals WPIN<1:3>, and the first to third write output control signals WPOUT<1:3>. When a read operation is performed, the bank address latch circuit 4 may latch the first and second bank addresses BA<1:2> in response to the first and second read input control signals RPIN<1:2>, and output the latched first and second bank addresses BA<1:2> as the first and second latch bank address signals LBA<1:2> in response to the first and second read output control signals RPOUT<1:2>. When a write operation is performed, the bank address latch circuit 4 may latch the first and second bank addresses BA<1:2> in response to the first to third write input control signals WPIN<1:3>, and output the latched first and second bank addresses BA<1:2> as the first and second latch bank address signals LBA<1:2> in response to the first to third write output control signals WPOUT<1:3>.

The read pipe latch circuit 5 may generate a read auto-precharge latch signal RAP_LAT by latching the read auto-precharge flag signal RAP_FLAG in response to the first and second read input control signals RPIN<1:2> and the first and second read output control signals RPOUT<1:2>. The read pipe latch circuit 5 may latch the read auto-precharge flag signal RAP_FLAG in response to the first and second read input control signals RPIN<1:2>, and output the latched read auto-precharge flag signal RAP_FLAG as the read auto-precharge latch signal RAP_LAT in response to the first and second read output control signals RPOUT<1:2>.

The write pipe latch circuit 6 may generate a write auto-precharge latch signal WAP_LAT by latching the write auto-precharge flag signal WAP_FLAG in response to the first to third write input control signals WPIN<1:3> and the first to third write output control signals WPOUT<1:3>. The write pipe latch circuit 6 may latch the write auto-precharge flag signal WAP_FLAG in response to the first to third write control signals WPIN<1:3>, and output the latched write auto-precharge flag signal WAP_FLAG as the write auto-precharge latch signal WAP_LAT in response to the first to third write output control signals WPOUT<1:3>.

The bank decoder 7 may generate first to fourth bank decoding signals BDEC<1:4> by decoding the first and second latch bank address signals LBA<1:2>. The bank decoder 7 may generate the first to fourth bank decoding signals BDEC<1:4> which are selectively enabled according to a logic level combination of the first and second latch bank address signals LBA<1:2>. For example, the bank decoder 7 may enable only the first bank decoding signal BDEC<1> to a logic high level when the first and second latch bank address signals LBA<1:2> have a logic level combination of 'L, L', and enable only the second bank decoding signal BDEC<2> to a logic high level when the first and second latch bank address signals LBA<1:2> have a logic level combination of 'L, H'. When the first and second latch bank address signals LBA<1:2> have a logic level combination of 'L, H', it may indicate that the first latch bank address signal LBA<1> is at a logic high level and the second latch bank address signal LBA<2> is at a logic low level. For example, suppose that the semiconductor device includes four banks. In this case, when a first bank (not illustrated) is activated during a read or write operation for the first bank, the first bank decoding signal BDEC<1> may be enabled, and when a second bank (not illustrated) is activated during a read or write operation for the second bank, the second bank decoding signal BDEC<2> may be enabled.

The auto-precharge signal generation circuit 8 may generate first to fourth auto-precharge signals APCGP<1:4> from the read auto-precharge latch signal RAP_LAT and/or the write auto-precharge latch signal WAP_LAT in response to the first to fourth bank decoding signals BDEC<1:4> and/or first to fourth RAS time signals tRAS<1:4>. Each of the first to fourth RAS time signals tRAS<1:4> may be enabled after a minimum RAS time tRAS required for an active read or write operation in each bank. For example, the first RAS time signal tRAS<1> may be enabled after a minimum RAS time tRAS required for an active operation in the first bank, and the second RAS time signal tRAS<2> may be enabled after a minimum RAS time tRAS required for an active operation in the second bank. When a read operation with an auto-precharge operation for the first bank is performed, the auto-precharge signal generation circuit 8 may generate the first auto-precharge signal APCGP<1> from the enabled read auto-precharge latch signal RAP_LAT in a state where the first bank decoding signal BDEC<1> and the first RAS time signal tRAS<1> are enabled.

Figure 2:
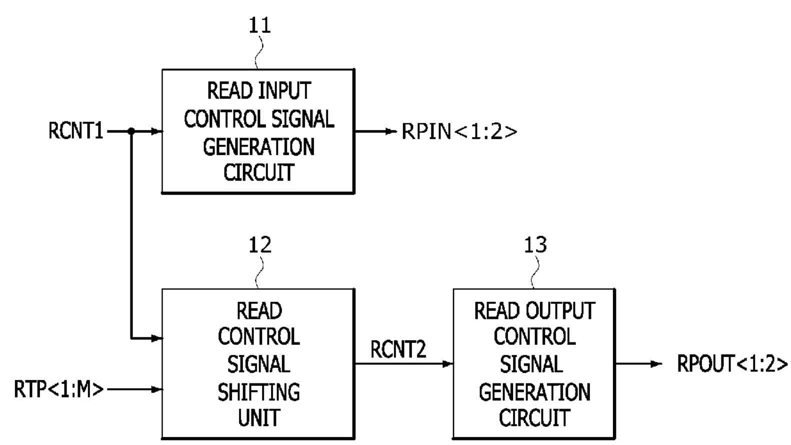
FIG. 2 is a block diagram illustrating a configuration of a read input/output control signal generation circuit included in the semiconductor device of FIG. 1.

Referring to FIG. 2, the read input/output control signal generation circuit 1 may include a read input control signal generation circuit 11, a read control signal shifting unit or circuit 12, and a read output control signal generation circuit 13.

The read input control signal generation circuit 11 may generate the first and second read input control signals RPIN<1:2> which are sequentially enabled in response to the first read control clock RCNT1. More specifically, the read input control signal generation circuit 11 may generate the first read input control signal RPIN<1> which is enabled in synchronization with the first read control clock RCNT1 which toggles after a read burst operation has ended, and then generate the second read input control signal RPIN<2> which is enabled in synchronization with the first read control clock RCNT1. When the first and second read input control signals RPIN<1:2> are enabled, a pulse having a preset pulse width can be generated.

The read control signal shifting unit 12 may generate the second read control clock RCNT2 by shifting the first read control clock RCNT1 by a preset section set through the first to Mth read shifting control signals RTP<1:M>. For example, the read control signal shifting unit 12 may generate the second read control clock RCNT2 by shifting the first read control clock RCNT1 by a two-cycle section of the operation clock, according to the second read shifting control signal RTP<2> which is enabled when the read-to-precharge time is set to 2tCK (two-cycle section of operation clock).

The read output control signal generation circuit 13 may generate the first and second read output control signals RPOUT<1:2> which are sequentially enabled in response to the second read control clock RCNT2. More specifically, the read output control signal generation circuit 13 may generate the first read output control signal RPOUT<1> which is enabled in synchronization with the second read control clock RCNT2 which toggles when the read-to-precharge time elapses after a read burst operation is ended, and then generate the second read output control signal RPOUT<2> which is enabled in synchronization with the second read control clock RCNT2. When the first and second read output control signals RPOUT<1:2> are enabled, a pulse having a preset pulse width can be generated.

Figure 3:
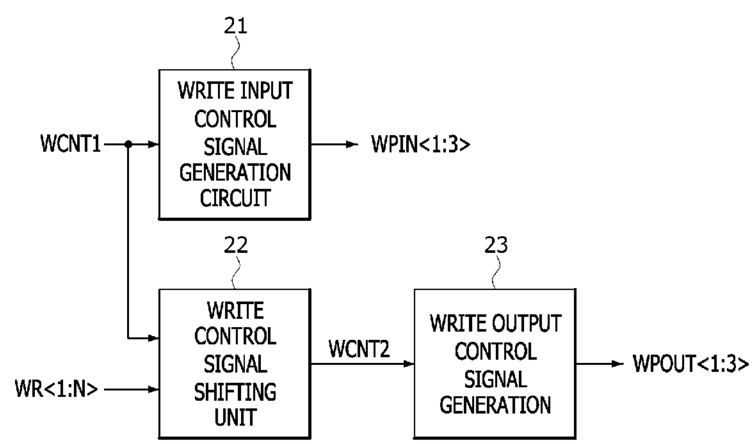
FIG. 3 is a block diagram illustrating a configuration of a write input/output control signal generation circuit included in the semiconductor device of FIG. 1.

Referring to FIG. 3, the write input/output control signal generation circuit 2 may include a write input control signal generation circuit 21, a write control signal shifting unit 22, and a write output control signal generation circuit 23.

The write input control signal generation circuit 21 may generate the first to third write input control signals WPIN<1:3> which are sequentially enabled in response to the first write control clock WCNT1. More specifically, the write input control signal generation circuit 21 may generate the first write input control signal WPIN<1> which is enabled in synchronization with the first write control clock WCNT1 which toggles after a write burst operation is ended, and then generate the second write input control signal WPIN<2> which is enabled in synchronization with the first write control clock WCNT1. When the first and second write input control signals WPIN<1:2> are enabled, a pulse having a preset pulse width can be generated.

The write control signal shifting unit 22 may generate the second write control clock WCNT2 by shifting the first write control clock WCNT1 by a preset section set through the first to Nth write shifting control signals WR<1:N>. For example, the write control signal shifting unit 22 may generate the second write control clock WCNT2 by shifting the first write control clock WCNT1 by a three-cycle section of the operation clock, according to the third write shifting control signal WR<3> which is enabled when the write recovery time is set to a 3tCK (three-cycle section of operation clock).

The write output control signal generation circuit 23 may generate the first to third write output control signals WPOUT<1:3> which are sequentially enabled in response to the second write control clock WCNT2. More specifically, the write output control signal generation circuit 23 may generate the first write output control signal WPOUT<1> which is enabled in synchronization with the second write control clock WCNT2 which toggles when the write recovery time elapses after a write burst operation is ended, and then the write output control signal generation circuit 23 may generate the second write output control signal WPOUT<2> which is enabled in synchronization with the second write control clock WCNT2. When the first and second write output control signals WPOUT<1:2> are enabled, a pulse having a preset pulse width can be generated.

Figure 4:
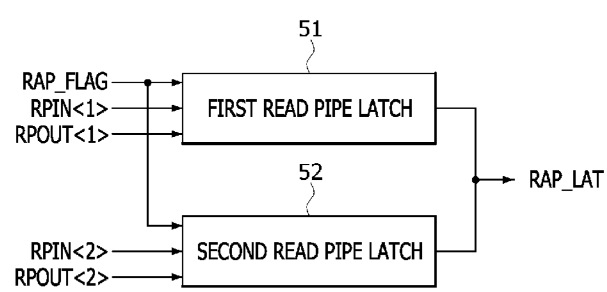
FIG. 4 is a block diagram illustrating a configuration of a read pipe latch circuit included in the semiconductor device of FIG. 1.

Referring to FIG. 4, the read pipe latch circuit 5 may include a first read pipe latch 51 and a second read pipe latch 52.

The first read pipe latch 51 may latch the read auto-precharge flag signal RAP_FLAG in response to the first read input control signal RPIN<1>, and output the latched read auto-precharge flag signal RAP_FLAG as the read auto-precharge latch signal RAP_LAT in response to the first read output control signals RPOUT<1>.

The second read pipe latch 52 may latch the read auto-precharge flag signal RAP_FLAG in response to the second read input control signal RPIN<2>, and output the latched read auto-precharge flag signal RAP_FLAG as the read auto-precharge latch signal RAP_LAT in response to the second read output control signal RPOUT<2>.

Figure 5:
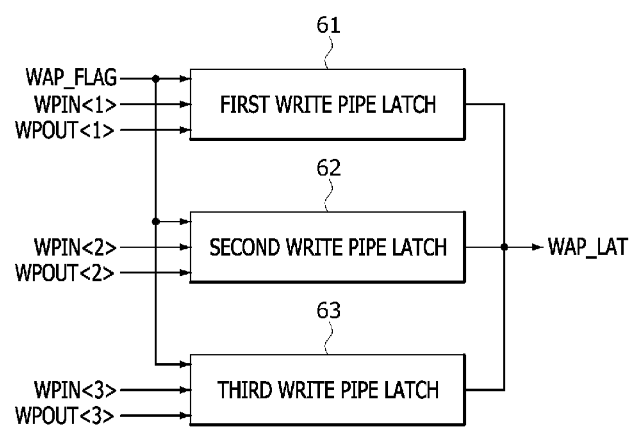
FIG. 5 is a block diagram illustrating a configuration of a write pipe latch circuit included in the semiconductor device of FIG. 1.

Referring to FIG. 5, the write pipe latch circuit 6 may include a first write pipe latch 61, a second write pipe latch 62, and a third write pipe latch 63.

The first write pipe latch 61 may latch the write auto-precharge flag signal WAP_FLAG in response to the first write input control signal WPIN<1>, and output the latched write auto-precharge flag signal WAP_FLAG as the write auto-precharge latch signal WAP_LAT in response to the first write output control signal WPOUT<1>.

The second write pipe latch 62 may latch the write auto-precharge flag signal WAP_FLAG in response to the second write input control signal WPIN<2>, and output the latched write auto-precharge flag signal WAP_FLAG as the write auto-precharge latch signal WAP_LAT in response to the second write output control signal WPOUT<2>.

The third write pipe latch 63 may latch the write auto-precharge flag signal WAP_FLAG in response to the third write input control signal WPIN<3>, and output the latched write auto-precharge flag signal WAP_FLAG as the write auto-precharge latch signal WAP_LAT in response to the third write output control signal WPOUT<3>.

Hereafter, the operation of the semiconductor device having the above-described configuration will be described. The operation of the semiconductor device may be divided into a case in which a read operation with an auto-precharge operation is performed and a case in which a write operation with an auto-precharge operation is performed.

When a read operation with an auto-precharge operation for the first bank is performed, the enabled read auto-precharge flag signal RAP_FLAG may be generated from the auto-precharge start signal APSTR which is enabled for the auto-precharge operation after the read operation for the first bank is performed. The read auto-precharge flag signal RAP_FLAG may be latched in the read pipe latch circuit 5 in synchronization with the first and second read input control signals RPIN<1:2>, and outputted as the read auto-precharge latch signal RAP_LAT in synchronization with the first and second read output control signals RPOUT<1:2>. The first and second bank addresses BA<1:2> may be latched in the bank address latch circuit 4, and then decoded through the bank decoder 7. When the read operation for the first bank was performed, the first bank decoding signal BDEC<1> may be enabled. When the first RAS time signal tRAS<1> is enabled after the minimum RAS time tRAS required for an active operation in the first bank, the first auto-precharge signal APCGP<1> enabled for the auto-precharge operation for the first bank may be generated from the read auto-precharge latch signal RAP_LAT.

When a write operation with an auto-precharge operation for the second bank is performed, the enabled write auto-precharge flag signal WAP_FLAG may be generated from the auto-precharge start signal APSTR which is enabled for the auto-precharge operation after the write operation for the second bank is performed. The write auto-precharge flag signal WAP_FLAG may be latched in the write pipe latch circuit 6 in synchronization with the first to third write input control signals WPIN<1:3>, and outputted as the write auto-precharge latch signal WAP_LAT in synchronization with the first to third write output control signals WPOUT<1:3>. The first and second bank addresses BA<1:2> may be latched in the bank address latch circuit 4, and then decoded through the bank decoder 7. When a write operation for the second bank is performed, the second bank decoding signal BDEC<2> may be enabled. When the second RAS time signal tRAS<2> is enabled after the minimum RAS time tRAS required for an active operation in the second bank, the second auto-precharge signal APCGP<2> enabled for the auto-precharge operation for the second bank may be generated from the write auto-precharge latch signal WAP_LAT.

As described above, when a read operation with an auto-precharge operation or a write operation with an auto-precharge operation is performed, the semiconductor device in accordance with the present embodiment may latch the read auto-precharge flag signal RAP_FLAG and the write auto-precharge flag signal WAP_FLAG for the auto-precharge operation in the latch circuits which are provided separately from the first and second bank addresses BA<1:2>. Thus, since the read auto-precharge flag signal RAP_FLAG and the write auto-precharge flag signal WAP_FLAG for the auto-precharge operation for each bank do not need to be separately stored, the layout area of the circuit for generating the auto-precharge signal can be reduced.

The semiconductor device which has been described with reference to FIG. 1 may be applied to electronic systems including a memory system, a graphic system, a computing system, and a mobile system. For example, referring to FIG. 6, an electronic system 1000 in accordance with an embodiment may include a data storage or data storage unit 1001, a memory controller 1002, a buffer memory 1003, and an input/output interface 1004.

The data storage unit 1001 may store data applied from the memory controller 1002, or read data stored therein and output the read data to the memory controller 1002, according to a control signal from the memory controller 1002. The data storage unit 1001 may include the semiconductor device illustrated in FIG. 1. The data storage unit 1001 may include a nonvolatile memory which can continuously store data stored therein even though power supply is cut off. The nonvolatile memory may include flash memory (Nor Flash Memory, NAND Flash Memory), PRAM (Phase Change Random Access Memory), RRAM (Resistive Random Access Memory), STTRAM (Spin Transfer Torque Random Access Memory), and MRAM (Magnetic Random Access Memory).

Figure 6:
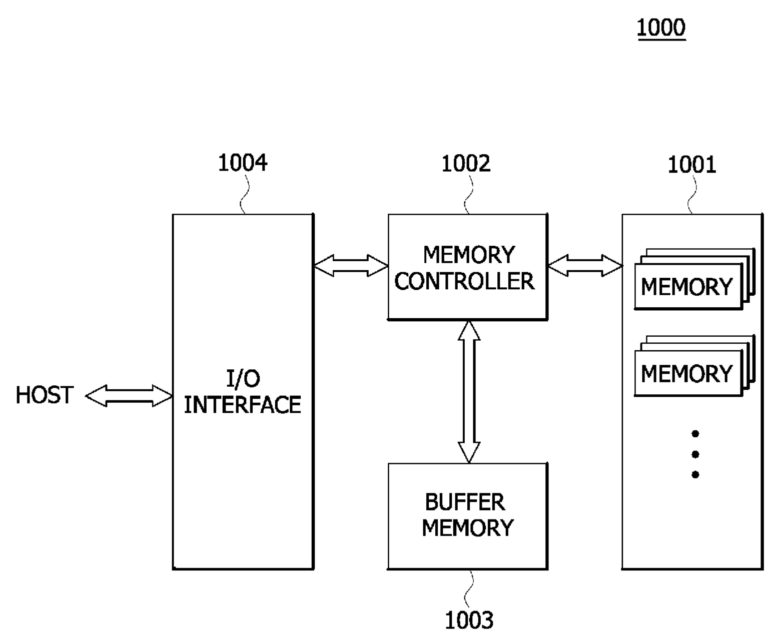
FIG. 6 is a diagram illustrating a configuration of an electronic system to which the semiconductor device of FIG. 1 is applied.

The memory controller 1002 may decode a command applied from an external device (host device) through the input/output interface 1004, and control data input/output for the data storage unit 1001 and the buffer memory 1003 according to the decoding result. In FIG. 6, the memory controller 1002 is represented by one block. However, the memory controller 1002 may separately include a controller for controlling the data storage unit 1001 and a controller for controlling the buffer memory 1003 which is a volatile memory.

The buffer memory 1003 may temporarily store data to be processed by the memory controller 1002, that is, data to be inputted to or outputted from the data storage unit 1001. The buffer memory 1003 may store data DATA applied from the memory controller 1002 according to a control signal. The buffer memory 1003 may read the stored data and output the read data to the memory controller 1002. The buffer memory 1003 may include a volatile memory such as DRAM (Dynamic Random Access Memory), mobile DRAM, or SRAM (Static Random Access Memory).

The input/output interface 1004 may provide a physical connection between the memory controller 1002 and an external device (host), such that the memory controller 1002 can receive a control signal for data input/output from the external device and exchange data with the external device. The input/output interface 1004 may include one of various interface protocols such as USB (Universal Serial Bus), MMC (Multi Media Card), PCI-E (Peripheral Component Interconnect Express), SCSI (Small Computer System Interface), SAS (Serial Attached SCSI), SATA (Serial Advanced Technology Attachment), PATA, ESDI (Enhanced Small Disk Interface), and IDE (Integrated Drive Electronics).

The electronic system 1000 may be used as a secondary memory device or external storage device of the host device. The electronic system 1000 may include an SSD (Solid State Disk), a USB memory, an SD (Secure Digital) card, a mSD (mini Secure Digital) card, a micro SD card, an SDHC (Secure Digital High Capacity) card, a memory stick card, an SM (Smart Media) card, a MMC, an eMMC (Embedded MMC), and a CF (Compact Flash) card.

In accordance with the embodiments of the present disclosure, since the auto-precharge flag signal and the bank address are latched in separate latch circuits, the semiconductor device does not need to generate and latch the auto-precharge flag signal for each bank. Thus, the layout area can be reduced.

Although preferred embodiments of the disclosure have been disclosed for illustrative purposes, those skilled in the art will appreciate that various modifications, additions, and substitutions are possible, without departing from the scope and spirit of the disclosure as defined in the accompanying claims.

What is claimed is:

1. A semiconductor device comprising:

an input/output control signal generation circuit configured to generate at least one input control signal and at least one output control signal from a first control clock in response to at least one shifting control signal;

a bank address latch circuit configured to generate at least one latch bank address signal by latching at least one bank address in response to the at least one input control signal and the at least one output control signal;

a pipe latch circuit configured to generate an auto-precharge latch signal by latching an auto-precharge flag signal in response to the at least one input control signal and the at least one output control signal; and an auto-precharge signal generation circuit configured to generate at least one auto-precharge signal from the auto-precharge latch signal in response to at least one bank decoding signal generated by decoding the at least one bank address signal.

2. The semiconductor device of claim 1, wherein the at least one shifting control signal comprises two or more bits of which a logic level combination is set according to a read-to-precharge time.

3. The semiconductor device of claim 1, wherein the first control clock is set to toggle after all data corresponding to a bit number set to a burst are all outputted during a read operation.

4. The semiconductor device of claim 1, wherein the input/output control signal generation circuit generates at least one first input control signal in synchronization with the first control clock, generates a second control clock by shifting the first control clock by a preset section according to the at least one shifting control signal, and generates the at least one output control signal in synchronization with the second control clock.

5. The semiconductor device of claim 1, wherein the bank address latch circuit latches the at least one bank address in response to the at least one input control signal, and outputs the at least one latched bank address as the at least one latch bank address signal in response to the at least one output control signal.

6. The semiconductor device of claim 1, wherein the pipe latch circuit latches the auto-precharge flag signal in response to the at least one input control signal, and outputs the latched auto-precharge flag signal as the auto-precharge latch signal in response to the at least one output control signal.

7. The semiconductor device of claim 1, wherein the auto-precharge signal generation circuit generates the at least one auto-precharge signal from the auto-precharge latch signal after a minimum RAS time for a bank in which a read operation is performed.

8. The semiconductor device of claim 1, wherein the at least one shifting control signal comprises two or more bits of which a logic level combination is set according to a write recovery time.

9. The semiconductor device of claim 1, wherein the first control clock is set to toggle after data corresponding to a bit number set to a burst are all inputted during a write operation.

10. The semiconductor device of claim 1, wherein the input/output control signal generation circuit generates at least one second input control signal in synchronization with the first control clock, generates a second control clock by shifting the first control clock by a preset section according to the at least one shifting control signal, and generates the at least one output control signal in synchronization with the second control clock.

11. The semiconductor device of claim 1, wherein the bank address latch circuit latches the at least one bank address in response to the at least one input control signal, and outputs the at least one latched bank address as the at least one latch bank address signal in response to the at least one output control signal.

12. The semiconductor device of claim 1, wherein the pipe latch circuit latches the auto-precharge flag signal in response to the at least one input control signal, and outputs the latched auto-precharge flag signal as the auto-precharge latch signal in response to the at least one output control signal.

13. The semiconductor device of claim 1, wherein the auto-precharge signal generation circuit generates the at least one auto-precharge signal from the auto-precharge latch signal after a minimum RAS time for a bank in which a write operation is performed.

14. A semiconductor device comprising:

a first input/output control signal generation circuit configured to generate at least one first input control signal and at least one first output control signal from a first control clock in response to at least one first shifting control signal;

a second input/output control signal generation circuit configured to generate at least one second input control signal and at least one second output control signal from a second control clock in response to at least one second shifting control signal;

a bank address latch circuit configured to generate at least one latch bank address signal by latching at least one bank address in response to the at least one first input control signal and the at least one first output control signal;

a first pipe latch circuit configured to generate a first auto-precharge latch signal by latching a first auto-precharge flag signal in response to the at least one first input control signal and the at least one first output control signal;

a second pipe latch circuit configured to generate a second auto-precharge latch signal by latching a second auto-precharge flag signal in response to the at least one second input control signal and the at least one second output control signal; and an auto-precharge signal generation circuit configured to generate at least one auto-precharge signal from the first or second auto-precharge latch signal in response to at least one bank decoding signal generated by decoding the at least one latch bank address signal.

15. The semiconductor device of claim 14, wherein the at least one first shifting control signal comprises two or more bits of which a logic level combination is set according to a read-to-precharge time.

16. The semiconductor device of claim 14, wherein the at least one second shifting control signal comprises two or more bits of which a logic level combination is set according to a write recovery time.

17. The semiconductor device of claim 14, wherein the first control clock is set to toggle after data corresponding to a bit number set to a burst are all outputted during a read operation, and the second control clock is set to toggle after data corresponding to a bit number set to a burst are all inputted during a write operation.

18. The semiconductor device of claim 14, wherein the first input/output control signal generation circuit generates the at least one first input control signal in synchronization with the first control clock, generates a third control clock by shifting the first control clock by a preset section according to the at least one first shifting control signal, and generates the at least one first output control signal in synchronization with the third control clock.

19. The semiconductor device of claim 14, wherein the second input/output control signal generation circuit generates the at least one second input control signal in synchronization with the third control clock, generates a fourth control clock by shifting the third control clock by a preset section according to the at least one second shifting control signal, and generates the at least one second output control signal in synchronization with the fourth control clock.

20. The semiconductor device of claim 14, wherein the auto-precharge signal generation circuit generates the at least one auto-precharge signal from the first auto-precharge latch signal after a minimum RAS time for a bank in which a read operation is performed, and generates the at least one auto-precharge signal from the second auto-precharge latch signal after a minimum RAS time for a bank in which a write operation is performed.

* * * * *